United States Patent [19]

Duck

[11] 4,010,376
[45] Mar. 1, 1977

[54] PHOTOCONDUCTIVE COMMUTATORS

[75] Inventor: Sherman W. Duck, Sunnyvale, Calif.

[73] Assignee: Bell & Howell Company, Chicago, Ill.

[22] Filed: Apr. 4, 1975

[21] Appl. No.: 565,313

[52] U.S. Cl. .................... 250/578; 250/211 R; 250/235; 250/567; 338/17

[51] Int. Cl.$^2$ ................................ H01J 39/12

[58] Field of Search ............ 250/211 R, 578, 559, 250/567, 235; 338/15, 17; 340/146.3 F

[56] References Cited

UNITED STATES PATENTS

| | | | |
|---|---|---|---|
| 3,082,327 | 3/1963 | Rice | 250/211 R X |
| 3,084,301 | 4/1963 | Mohan | 250/578 X |
| 3,124,635 | 3/1964 | Jones et al. | 250/578 X |
| 3,437,815 | 4/1969 | Bleicher | 250/211 R X |
| 3,732,424 | 5/1973 | Wojtulewicz | 250/235 X |

*Primary Examiner*—Eugene La Roche
*Attorney, Agent, or Firm*—Benoit Law Corporation

[57] ABSTRACT

First photoconductor material interconnecting a plurality of first electrodes with a first common electrode is scanned or swept with a beam of radiant energy to selectively interrogate or address individual ones of the plurality of first electrodes. A second plurality of electrodes may be associated with the first plurality and preferably is interdigitated therewith. Second photoconductor material, preferably being different from the first and having a slower rise time, interconnects associated ones of the first and second pluralities of electrodes so that the electrical resistance therebetween varies as a function of the quantum of radiant energy directed thereon. The second plurality of electrodes are connected either directly, photoconductively or otherwise with a second common electrode.

26 Claims, 8 Drawing Figures

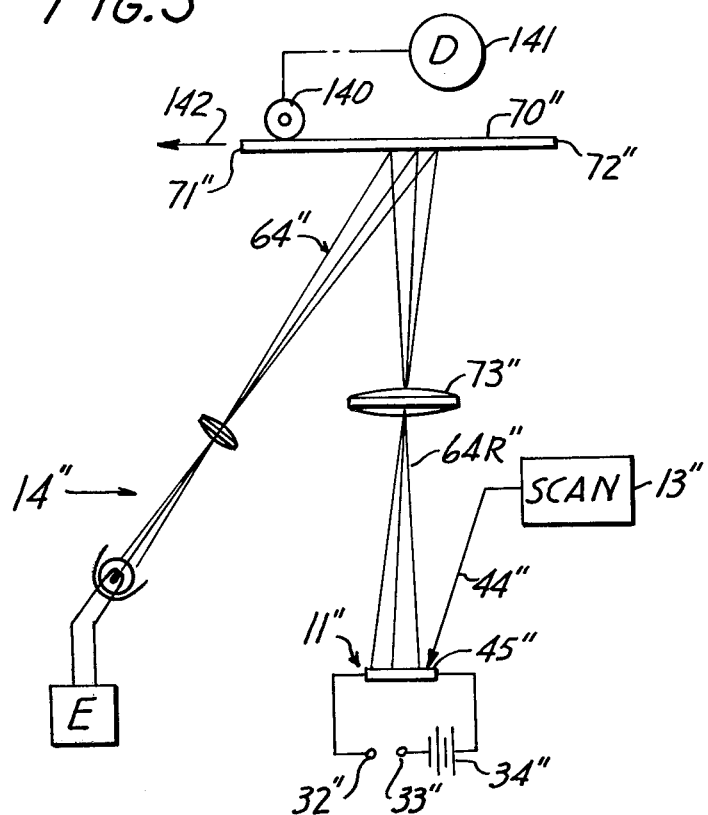
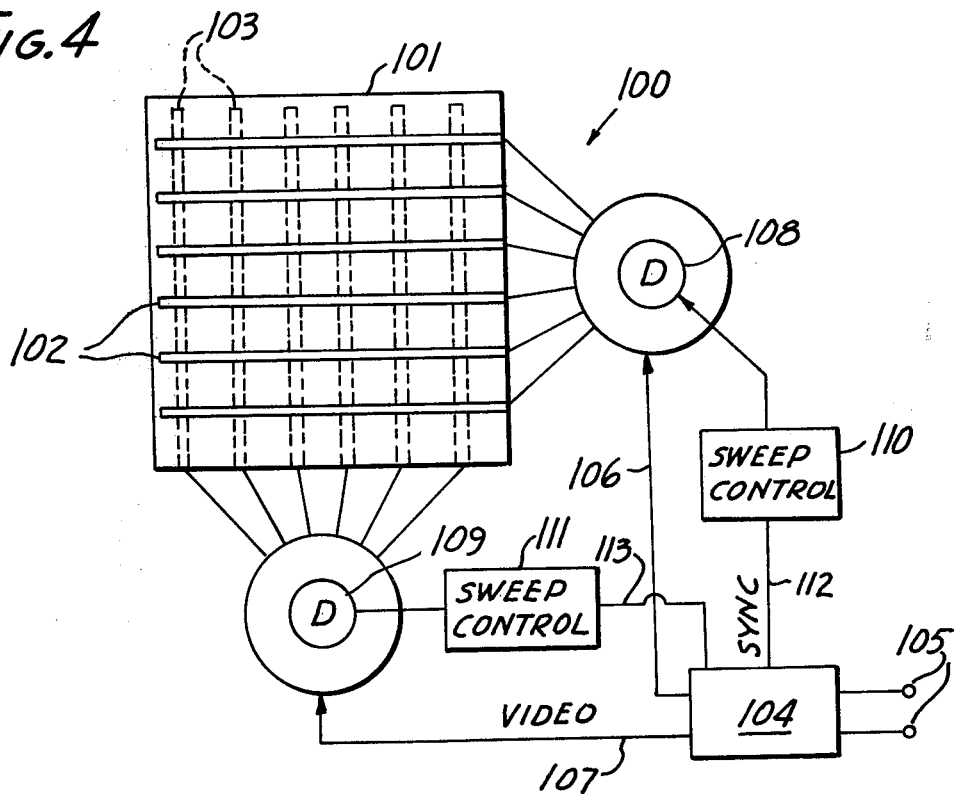

PHOTOCONDUCTIVE COMMUTATORS

BACKGROUND OF THE INVENTION

The present invention relates to the interrogating or addressing of a plurality of electrodes by selectively connecting individual ones thereof with a common electrode. Electrodes are so addressed and interrogated in various applications, such as the following: the sequential connection of a plurality of electrodes with associated electrical equipment; the scanning of electrode arrays; the selective addressing of points in coordinate systems defined by electrode sets; and in other similar applications.

Heretofore, it has been known to use brushes made of a suitable electrically conductive material, such as carbon, for selectively connecting individual ones of a plurality of electrodes with a common electrode. Such brushes, however, have a number of serious drawbacks. Firstly, such brushes are subject to excessive wear and thus require costly maintenance or replacement. Secondly, their brushing action inherently generates unwanted noise. Additionally, their brushing action may generate sparks. Consequently, such brushes are unsuitable for use in explosive environments.

Heretofore, electrodes have been addressed by the use of photoconductor materials. One example of a prior art system using photoconductor materials is disclosed in U.S. Pat. No. 3,265,928, issued to Nishino on Aug. 9, 1966. As illustrated by this patent, however, prior art systems and methods for so addressing electrodes are unduly complicated and cumbersome.

SUMMARY OF THE INVENTION

It is an object of the present invention to provide an improved method for selectively interrogating or addressing electrodes which eliminates the need of using brushes and hence obviates the aforementioned disadvantages associated therewith.

It is further an object of the present invention to provide an improved method as set forth characterized by being capable of selectively connecting individual ones of a plurality of electrodes with a common electrode.

It is additionally an object of the present invention to provide an improved method as set forth characterized by being capable of selectively connecting individual ones of a plurality of electrodes with a common electrode by scanning interconnecting photoconductor material with a beam of radiant energy.

It is another object of the present invention to provide an improved method for selectively connecting a plurality of electrodes with associated electrical equipment which is characterized by employing photoconductive scanning.

It is still another object of the present invention to provide an improved method for scanning an electrode array, such as a two dimensional electrode array formed by a plurality of interdigitated first and second electrodes, characterized by employing photoconductive scanning.

It is yet another object of the present invention to provide an improved method for selectively addressing points in a coordinate system defined by electrode sets characterized by employing photoconductive scanning.

It is additionally an object of the present invention to provide an improved method for scanning an input image into a two dimensional array made up of interdigitated first and second electrodes characterized by employing photoconductive scanning.

In accomplishing these and other objects, there is provided in accordance with the present invention a plurality of first electrodes electrically interconnected with a first common electrode by first photoconductor material. The first photoconductor material is scanned or swept with a beam of radiant energy to selectively interrogate or address individual ones of the plurality of first electrodes by selectively connecting the individual electrodes with the first common electrode.

In selected embodiments of the invention, a second plurality of electrodes is associated with the first plurality by being preferably interdigitated therewith. Second photoconductive material, preferably being different from the first and having a slower rise time, interconnects associated ones of the first and second pluralities of electrodes so that the electrical resistance therebetween varies as a function of the quantum of radiant energy directed thereon. The second plurality of electrodes are connected either directly, photoconductively or otherwise with a second common electrode.

Additional objects of the present invention reside in the specific methods of operation of the exemplary embodiments hereinafter particularly described in conjunction with the several drawings.

BRIEF DESCRIPTION OF THE DRAWINGS

FIG. 3 is a side view of yet another form of image transducer assembly.

FIG. 4 is a plan view of a video output display apparatus suitable for being driven by the output signals generated by the image transducer assemblies of FIGS. 1–3.

DETAILED DESCRIPTION OF THE PREFERRED EMBODIMENTS

Figure 1:
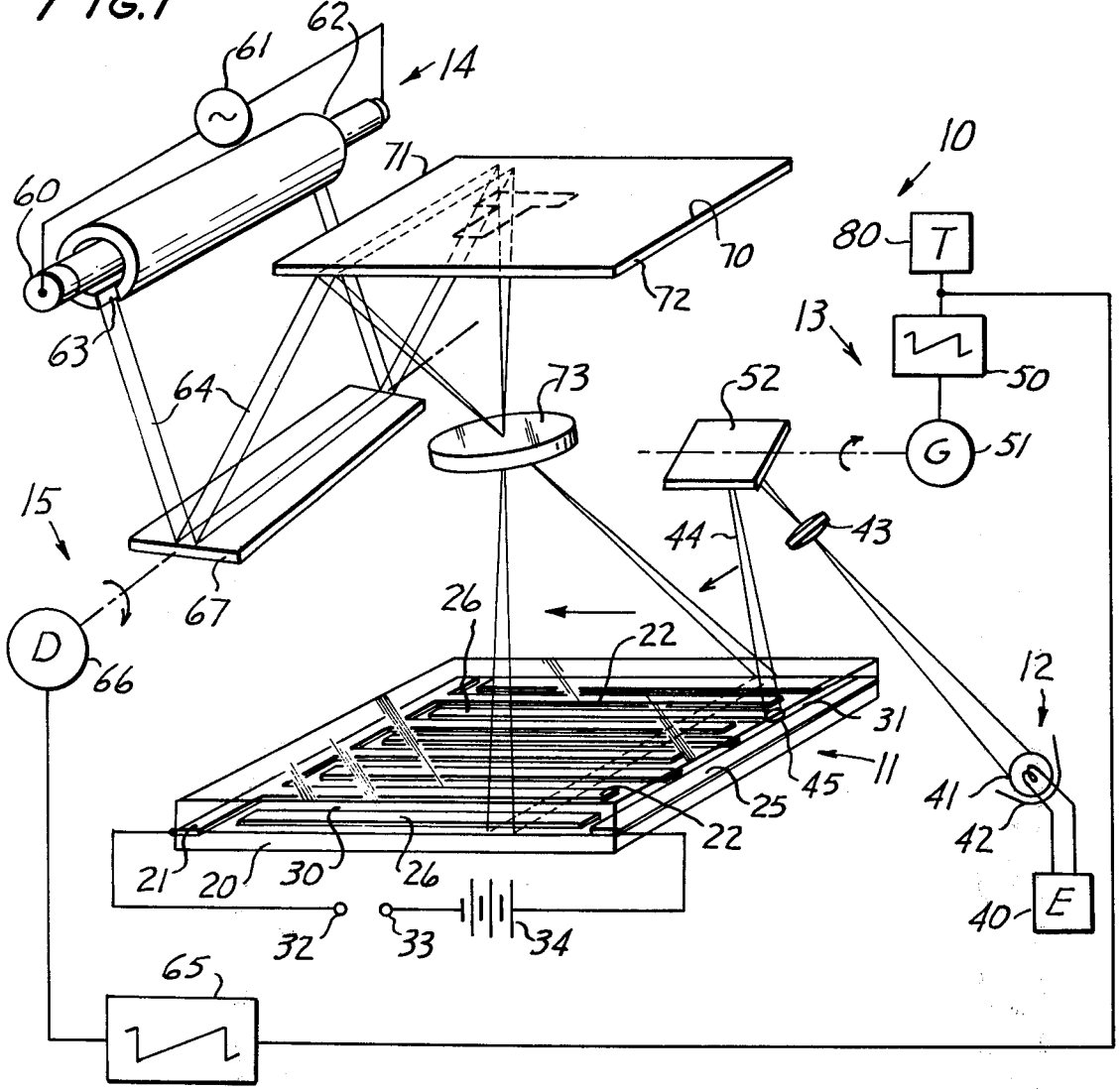
FIG. 1 is a perspective view of an image transducer assembly having an electrode array formed by a plurality of interdigitated first and second electrodes, the first electrodes being addressed in accordance with the present invention by being photoconductively scanned to connect individual ones thereof with a common electrode.

Referring to the drawings in more detail, there is shown in FIG. 1 an image transducer assembly generally identified by the numeral 10.

The transducer 10 is made up of a two dimensional electrode array 11, a point light source 12, apparatus 13 for scanning the array 11 with the point light source 12, a line light source 14, and apparatus 15 for scanning a document with the line light source 14.

The electrode array 11 is formed by two electrode sets mounted on a planar substantially rectangular shaped support 20. One of the electrode sets is made up of a common electrode 21 having a plurality of electrodes 22 extending therefrom. The common electrode 21 is preferably a planar rectangularly shaped element having a width relatively narrow in comparison to its longitudinal dimension. The common electrode 21 is dimensioned and positioned to extend along one edge of the planar base 20. The plurality of electrodes 22 are illustrated formed integral with the common electrode 21 and extend perpendicularly from the same side of the common electrode 21. The electrodes 22 are formed in substantially the same shape as the electrode 21 and are equally spaced apart a predetermined distance along the longitudinal dimension of the common electrode 21, thereby to define a set of equally spaced apart mutually parallel electrodes.

Positioned along the opposite edge of the planar base 20 in substantially parallel disposition to the electrode 21 is common electrode 25. The electrode 25 has substantially the same shape as the common electrode 21. Associated with the common electrode 25 are a plurality of electrodes 26. The electrodes 25, 26 form the other electrode set mounted on the planar base member 20.

The electrodes 26 preferably have substantially the same width and shape as the electrodes 22 and are positioned to define an interdigitated electrode pattern therewith. The electrodes 26 extend in a mutually parallel disposition substantially normal to the longitudinal axis of the common electrode 25. The side edges of the electrodes 26 are spaced a predetermined distance from their longitudinally adjacent electrodes 22 and their ends are spaced selected distances, not necessarily the same, from the common electrodes 21, 25.

The planar base 20 is made of an electrical nonconductive material so that the electrodes 21, 22, 25 and 26 thereon are electrically isolated from each other. The surface of the planar base shown upwardly positioned in FIG. 1 is covered over by photoconductor material having selected rise time. Preferably, a photoconductor material, such as cadmium sulfide, CdS, doped to have a relatively slow rise time, covers the spaces 30 between the electrodes 22, 26 to electrically interconnect these electrodes.

A strip of photoconductor material having a relatively fast rise time, such as cadmium selenide, CdSe, is positioned in the space 31 between the common electrode 25 and its associated plurality of electrodes 26 to electrically interconnect these electrodes. It is noted that the ends of the electrodes 26 adjacent the common electrode 25 are positioned closer thereto than the adjacent ends of the electrodes 22 so that the fast rise time photoconductor material in the space 31, while interconnecting electrodes 25 and 26, does not interconnect electrodes 22 and 25.

As is well known, photoconductor material has a conductance characteristic which is directly proportional to the quantum of radiant energy directed thereon. The purpose of a photoconductor material at location 31 of relatively faster rise time than at locations 30, as hereinafter explained, is to make the electrical resistance between the electrodes 25 and 26 in the presence of a selected beam of radiant energy negligible in comparison to the resistance between the electrodes 22 and 26. It is noted that the same effect may be accomplished by using photoconductor material having the same rise time in locations 30 and 31 while using a relatively higher intensity beam of radiant energy to illuminate the location 31 than that used to illuminate the locations 30.

The photoconductive materials employed in the methods and apparatus of the subject invention are well known and commercially available. Suitable data are set forth in the well-known book by Richard H. Bube, PHOTOCONDUCTIVITY OF SOLIDS (John Wiley & Sons, 1960), such as at pages 16, 17, 33, 89-93, 118-120, 169, 175, 187, 280, and 428.

The electrode array 11 has output terminals 32, 33 which are connected, respectively, to the common electrode 21, and through a DC voltage source or battery 34 to the common electrodes 25. As explained hereinafter, in operation of the transducer 10, an output signal is generated on the terminals 32, 33 which is directly proportioned to the instant electrical resistance between the common electrodes 21, 25.

The point light source 12 is constructed in a conventional manner and includes a power source 40, a lamp 41 driven by the power source 40, a light reflector 42 and a lens 43. The light source 12 operates to generate a light beam 44 which is reflected by the scanning apparatus 13 to direct and scan light point 45 along the strip of photoconductor material located at 31, thereby to selectively interconnect sequentially the electrodes 26 with the common electrode 25. As shown in FIG. 1, the point 45 of the beam of radiant energy 44 is sufficiently large to cover the photoconductor material in the location 31 and overlap the electrodes 25, 26.

The scanning apparatus 13 is formed by a driver circuit 50, a galvanometer coil 51 and a square shaped planar mirror 52. The mirror 52 is connected to be driven back and forth in a line of movement parallel to the length of the common electrode 25 by rotation of the coil 51. The mirror 52 is positioned to reflect the beam 44 onto the location 31 with the beam point 45 overlapping the electrodes 25, 26 as shown in FIG. 1.

The driver circuit 50 is a square wave generator which generates a square wave at a predetermined frequency. Each square wave output of the circuit 50 operates to scan or sweep the light point 45 at a linear rate from a scan start position at one end of the common electrode 25 along the electrode 25 to a scan end position at its other end. Upon reaching the scan end position, the mirror 52 is reset to the scan start position by the operation of the driver 50 and coil 51. It is noted that the selected frequency of the square wave generator 50 determines the rate or frequency at which the plurality of electrodes 26 are addressed or interrogated.

The line light source 14 is constructed in a conventional manner of a longitudinally extending cylindrically shaped lamp 60, an AC power source 61 and a cylindrical cover structure 62. The cover 62 defines along its length a rectangularly shaped light slot 63 and is positioned around the lamp 60. With the lamp 60 energized by the power source 61, a line of light 64 is outputted from the light slot 63, as shown in FIG. 1.

The scanning apparatus 15 includes a driver 65, a galvanometer coil 66 and a rectangularly shaped planar mirror 67. The mirror 67 is dimensioned and positioned to receive the line of light 64 from the light source 14 and operates to reflect the line of light 64 onto a master document 70, the image of which is to be reproduced.

The mirror 67 is connected to be driven between a line scan start position, whereat the light line 64 is positioned adjacent and parallel to edge 71 of the document 70, and a line scan end position, whereat the light 64 is positioned adjacent and parallel to document edge 72. Thus, energization of the coil 66 to rotate the mirror 67 between its scan start and stop positions operates to scan the light 64 across the entire document 70. It is noted the length of the light line 64 is at least as long as the dimension of the document across which it is scanned.

The driver 65 is a square wave generator and operates to drive the coil 66 in the same manner hereinbefore described in connection with driver 50 and coil 51. The frequency of the square wave output of the driver 65 is preferably lower than that of the driver 50 so that the point light source 45 is scanned at a faster rate than the light line 64.

The light line 64 is reflected from the surface of the master document 70 through lens 73 onto the array 11. The reflected portion of the light line 64, the intensity of which varies as a function of the portions of the document 70 from which it is reflected, is designated 64R. The lens 73 directs the reflected light line 64R onto the array 11 so that the line 64R extends thereacross in a substantially parallel disposition to the common electrodes 21, 25.

With the mirror 67 positioned in the scan start position, the light line 64R is reflected from the document edge 71 across the ends of the electrodes 22 adjacent the common electrode 25. In the scan stop position, the light line 64R is reflected from the document edge 72 across the ends of the electrodes 26 adjacent the common electrode 21. Thus, as the document 70 is scanned by the light line 64, the portion of this light line reflected from the document surface is scanned or swept across the interdigitated portions of the electrodes 22, 26 to illuminate the photoconductor material positioned in the spaces 30 therebetween.

Illumination of the photoconductor material in the spaces 30 between the interdigitated electrodes 22, 26 functions to produce image caused electrical resistances therebetween which are inversely proportional to the intensity of the portions of the reflected light 64R falling thereon. Hence, since the intensity of the reflected light 64R is directly related to and a function of the image on the document surface from which the light 64R is reflected, the electrical resistances of the photoconductor material between the electrodes 22, 26 are an electrical reproduction of the image on the document 70.

In operation of the transducer assembly 10, a timer 80 is provided which transmits trigger signals to simultaneously trigger in synchronization the drivers 50 and 65.

Triggering of the driver 65 scans the line of light 64 at a selected rate across the document 70, thereby to simultaneously scan the image caused variable intensity reflected line of light 64R across the photoconductor material between the electrodes 22, 26 to generate in the photoconductor material an electrical image of the portion of the document 70 being instantly scanned.

At the same time, the driver 50 scans the light point 45 at a faster rate of speed along the strip of photoconductor material located at 31 to sequentially connect one electrode 26 after the other in common with the common electrode 25. Connection of each electrode 26 with the common electrode 25 places the resistance of the photoconductor material between the addressed electrode 26 and its adjacent electrodes 22 across the battery 34 to generate on the output terminals 32 and 33 an electrical output signal proportional thereto and representative of the image of the document 70.

In this manner, the image transducer 10 operates to scan the document 70 and reproduce line by line an electrical image thereof on the array 11. The electrical image produced on the array 11 is converted into a time coincident electrical output signal on the output terminals 32, 33 by photoconductively addressing or interrogating the electrodes 26 by means of the point of light 45.

As before mentioned, the point of light 45 is scanned along the photoconductor material located at 31, between the ends of the electrodes 26 and the common electrode 25, to alter the resistance of this photoconductor material to a valve which is negligible in comparison to the resistance of the other photoconductor material between the addressed electrode 26 and its associated electrodes 22. Thus, the output generated across the terminals 32, 33 is a time coincident representation of the image of the document 20.

The electrical signal produced by the line scanning operation of the image transducer 10 is much like the video signal obtained in television scanning. As hereinafter explained in connection with FIG. 4, the output of the transducer 10 may be used to drive the video display shown in FIG. 4. It is noted that the resolution of the image transducer 10 is controlled by the spacing of the electrodes 22, 26; the width of the light line 64; and the scan rate of the light line 64 relative to the rate at which the electrodes 26 are addressed.

Referring to FIG. 4, a video display apparatus 100 is there shown. The dislay apparatus 100 includes an electroluminescent sheet 101. A plurality of mutually perpendicular grid electrodes 102 and 103 are positioned in mutually parallel planes on opposite sides of the sheet 101. The electroluminescent sheet 101 is made of photoemissive material and operates to emit light from its areas positioned between crossing grid electrodes 102, 103 as a function of the strength of the electrical signal applied thereacross by the grid electrodes.

In the display apparatus 100, the image output of the tansducer 10 which is modulated with video information representing the image of the document 70 is fed as an imput to video control circuit 104 on terminals 105 thereof. The circuit 104 transmits this image input as a video signal on leads 106, 107. The leads 106, 107 are sequentially connected to the grid electrodes 102, 103, respectively, by the sweep circuits 108, 109. The scan rates of the sweep circuits 108, 109 are controlled by sweep controls 110, 111, respectively, and these sweep controls are set to correspond to the scan rates of the drivers 50, 65 of the image transducer 10. Thereby, the electroluminescent sheet 101 upon which the image of the document 70 is to be produced is scanned in the same manner as the array 11.

Upon receipt of an image output signal from the transducer 10, the control circuit 104 also operates to generate a synchronization signal on leads 112, 113. This synchronization signal is applied to the sweep control circuits 110, 111 and functions to synchronize the operation of the sweep circuits 108, 109 with the scans 13, 15 of the transducer 10. Thereby, the image output signal of the transducer 10 is sequentially applied by the sweep circuits 108, 109 to the grid electrodes 102, 103 to reproduce on the electroluminescent screen 101 the image of the master document 70.

Figure 7:
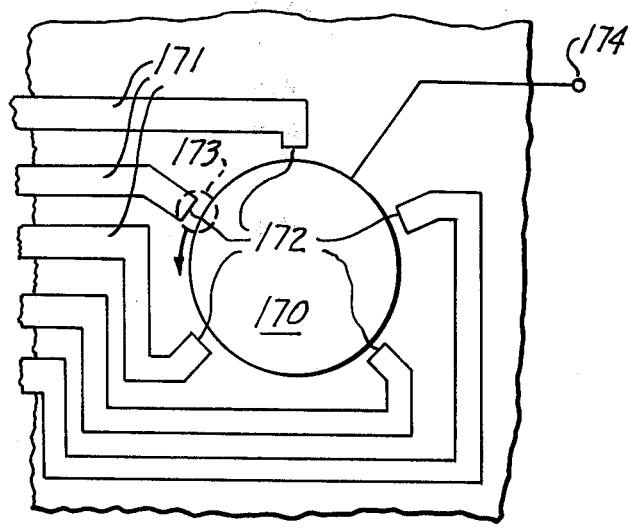
FIG. 7 is a plan view of another electrode array formed by a circularly shaped common electrode having a set of other electrodes associated therewith.
Figure 8:
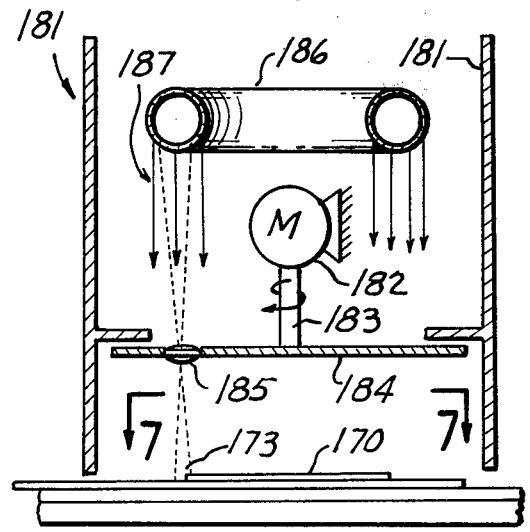
FIG. 8 is a side view of scanning apparatus associated with the electrode array of FIG. 7.

It is noted that the sweep circuits 108, 109, which are diagramatically illustrated in FIG. 4, preferably incorporate the electrode configuration and photoconductive scanning arrangement shown in FIGS. 7 and 8.

Figure 2:
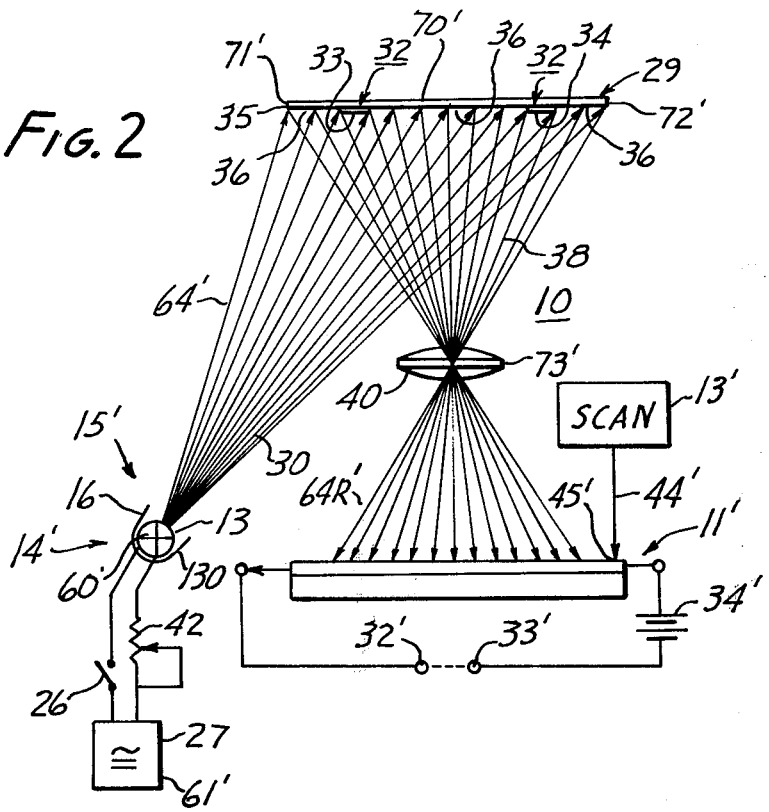
FIG. 2 is a side view of a modified form of image transducer asembly.

Referring to the FIG. 2 and 3, modified forms of image transducers are there shown generally identified by the numeral 10' and 10'' respectively. The transducers 10' and 10'' are constructed and operate in substantially the same manner as the abovedescribed image transducer 10, except for the differences hereinafter noted. Portions of the trnsducer 10' and 10'' corresponding to that of the transducer 10 are identified by the same numerals with a prime and double prime added, respectively.

The image transducer 10' differs in construction and operation from the transducer 10 in the following respects. The line of light 64' is generated by use of a reflector 130 instead of a light slot 63. Further, the light line 64' is scanned across the master document 70', from its one edge 71' to its other edge 72', by moving the light source 14' itself instead of using a galvanometer coil to rotate a reflecting mirror 67.

The image transducer 10'' differs in construction and operation from the abovedescribed image transducers 10 and 10' by having its line light source 14'' fixedly positioned and by generating the line sweep across the document 70'' by moving the document itself. As shown in FIG. 3, roller mechanism 140 is synchronously driven by scan circuitry 141 to move the document 70'' in the direction indicated by the arrow 142. Thereby, the document 70'' is scanned by the line of light 64''.

Figure 5:
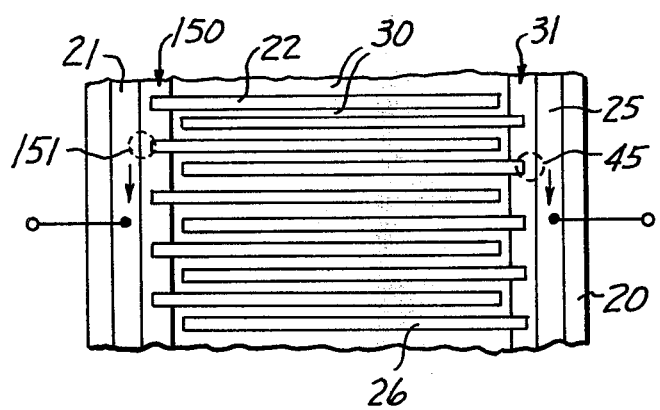
FIG. 5 is a plan view of an alternate form of electrode array having an interdigitated electrode pattern.

FIG. 5 illustrates an alternate form of electrode array 11 in which the plurality of electrodes 22, instead of being formed integral with the common electrode 21, are selectively connected thereto by being photoconductively scanned. A strip of photoconductor material 150, preferably having a fast rise time, is located in the region between the common electrode 21 and the adjacent ends of the electrodes 22. Thereby, by scanning a beam of radiant energy 151 therealong, the electrodes 22 may be selectively connected to the common electrode 21 in the same manner previously described in which the electrodes 26 are sequentially addressed by being connected to the common electrode 25.

It is noted that the beams of radiant energy 45 and 151 are simultaneously scanned at the same rate with an offset distance therebetween equal to the spacing between two adjacent electrodes 22, 26.

Thereby, adjacent electrodes 22, 26 are sequentially connected to the common electrodes 21, 25 to measure the resistance characteristic of the slow rise time photoconductor material positioned in the space 30 therebetween.

Figure 6:
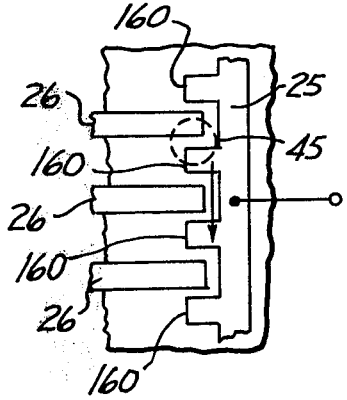
FIG. 6 is a plan view of an array of electrodes formed by a common electrode having extensions thereon arranged to define an interdigitated pattern with a plurality of other electrodes.

FIG. 6 illustrates the common electrode 25 with extensions 160 formed thereon to extend in an interdigitated pattern between its associated plurality of electrodes 26. As below explained, such an electrode configuration permits the use of a lower intensity light beam 45.

In the electrode configuration shown in FIG. 6, a longer length of photoconductor material lies between the overlap of the extensions 160 and the electrodes 26 than did between the ends of the electrodes 26 and the common electrode 25. Illumination of the entire length of this photoconductor material between the extensions 160 and the electrodes 26 by the radiant beam 45 has the effect of connecting in parallel the entire illuminated length of this photoconductor material between the electrodes 25, 26. Hence, since resistances in parallel produce a combined resistance in accordance with the formula $1/R = 1/R' + 1/R'' + 1/R''' \ldots$ where R equals the combined resistance and the R primes equal the resistances of all the parallel resistive paths, it is apparent that the longer the length of the illuminated photoconductor material interconnecting the electrodes 25, 26 the lower is its combined resistance. Thus, a lower intensity radiant beam 45 may be used with the electrode configuration shown in FIG. 6 to render negligible the resistance of the photoconductor material between the electrodes 26 and extensions 160.

FIG. 7 shows an alternate electrode configuration, suitable for use in the video display sweep circuits 107, 108, made up of a circularly shaped common electrode 170 associated with a plurality of electrodes 171. Ends 172 of the electrodes 171 are positioned radially in a circular disposition at equally circumferential spaced apart positions around the outer periphery of the circular electrode 170. Photoconductor material having a light-to-dark resistance ratio, such as $10^9$ or more, interconnects the electrode ends 172 with the common electrode 170. A light spot 173 is scanned around the outer periphery of the common electrode 170 to sequentially address the electrodes 171 by electrically connecting them with the common electrode 170. An electrical terminal 174 is illustrated connected to the common electrode 170.

FIG. 8 illustrates apparatus 180 for generating the scanned light spot 173. The apparatus is made up of a housing 181 having a motor 182 mounted therein centrally above the common electrode 170. Mounted on the motor shaft 183 is a disc 184 having an opening therein which carries lens 185. As the motor 182 rotates, the lens 185 circumscribes a circular path above and conforming to the shape of the outer periphery of the common electrode 170. An annular light source 186 is mounted concentric with and above the rotating disc 184 which directs light 187 downwardly on the disc 184. The lens 185 converts this light 187 into the rotating light spot 173. Structure 188 is mounted to extend inwardly from the housing 181 above the disc 184 to prevent the downward transmission of light from the source 186, except through the lens 185.

It is noted that the term photoconductor material is used herein in a generic sense to refer to and encompass photoconductive, photoresistive and photovoltaic materials as well as other equivalent types of material.

Although the invention has herein been shown and described in what is conceived to be the most practical and preferred embodiment, it is recognized that departures may be made therefrom within the scope of this invention.

I claim:

1. In a method of selectively addressing points in a coordinate system, the improvement comprising in combination:

providing a coordinate system of a plurality of first electrodes and a plurality of second electrodes by arranging said first and second electrodes in mutually parallel planes;

providing a further first electrode adjacent said first electrodes;

providing a further second electrode adjacent said second electrodes;

providing photoconductor material between said further first electrode and said plurality of first electrodes;

providing photoconductor material between said further second electrode and said plurality of second electrodes;

connecting said further first electrode and said further second electrode to electrical equipment with respect to which said points are to be addressed;

scanning a first beam of radiant energy along an edge of said further first electrode in a continuous scanning path and selectively rendering photoconductor material between said further first electrode and said plurality of first electrodes photoconductive with said first beam of radiant energy to selectively connect said further first electrode to said plurality of first electrodes; and scanning a second beam of radiant energy along an edge of said further second electrode in a continuous scanning path and selectively rendering photoconductor material between said further second electrode and said plurality of second electrodes photoconductive with said second beam of radiant energy to selectively connect said further second electrode to said plurality of second electrodes.

2. A method as claimed in claim 1, wherein:

said further first electrode is made circular;

said plurality of first electrodes is provided with end portions radially arranged in a circular array adjacent and about said circular further first electrode;

photoconductor material is provided between said circular further first electrode and said end portions of said plurality of first electrodes; and said beam of radiant energy is scanned along a peripheral portion of said circular further first electrode.

3. In a method of selectively addressing points in a coordinate system, the improvement comprising in combination:

providing a coordinate system of a plurality of first electrodes and a plurality of second electrodes;

providing photoemissive material between said pluralities of first and second electrodes;

providing a further first electrode adjacent said first electrodes;

providing a further second electrode adjacent said second electrodes;

providing photoconductor material between said further first electrode and said plurality of first electrodes;

providing photoconductor material between said further second electrode and said plurality of second electrodes;

connecting said further first electrode and said further second electrode to electrical equipment with respect to which said points are to be addressed and applying electrical energy for exciting said photoemissive material to said further first and second electrodes;

scanning a first beam of radiant energy along an edge of said further first electrode in a continuous scanning path and selectively rendering photoconductor material between said further first electrode and said plurality of first electrodes photoconductive with said first beam of radiant energy to selectively connect said further first electrode to said plurality of first electrodes; and scanning a second beam of radiant energy along an edge of said further second electrode in a continuous scanning path and selectively rendering photoconductor material between said further second electrode and said plurality of second electrodes photoconductive with said second beam of radiant energy to selectively connect said further second electrode to said plurality of second electrodes.

4. A method as claimed in claim 3, wherein:

said electrical energy is modulated with information.

5. A method as claimed in claim 3, wherein:

said electrical energy is modulated with video information for a visual display by said photoemissive material.

6. A method as claimed in claim 3, wherein:

said further first electrode is made circular;

said plurality of first electrodes is provided with end portions arranged in a circular array adjacent and about said circular further first electrodes;

photoconductor material is provided between said circular further first electrode and said end portions of said plurality of first electrodes; and said beam of radiant energy is scanned along a peripheral portion of said circular further first electrode.

7. A method of selectively connecting a plurality of electrodes to electrical equipment, comprising in combination the steps of:

providing a circular electrode;

providing said plurality of electrodes with end portions radially arranged in a circular array adjacent and about said circular electrode;

providing photoconductor material between said circular electrode and said electrode end portions; and scanning a beam of radiant energy along a peripheral portion of said circular electrode and selectively rendering said photoconductor material photoconductive with said scanning beam of radiant energy to selectively connect said circular electrode to said plurality of electrodes.

8. A method as claimed in claim 7, wherein:

said beam of radiant energy is scanned along a peripheral portion of said circular electrode in a continuous scanning path.

9. A method as claimed in claim 7, wherein:

said beam of radiant energy is scanned to sequentially connect electrodes of said plurality of electrodes to said circular electrode by way of said photoconductive material.

10. In a method of scanning a two-dimensional array, the improvement comprising in combination the steps of:

providing said two-dimensional array with a plurality of interdigitated first and second electrodes;

providing a first common electrode adjacent said plurality of first electrodes;

providing a second common electrode adjacent said plurality of second electrodes;

providing photoconductor material between at least said interdigitated first and second electrodes and between said first common electrode and said plurality of first electrodes, connecting said first and second common electrodes to electrical equipment with respect to which said array is to be scanned;

connecting each of said plurality of second electrodes to said second common electrode;

sweeping said interdigitated electrodes with a band of radiant energy extending across said interdigitated first and second electrodes and advancing in a longitudinal direction of said interdigitated first and second electrodes and selectively rendering the photoconductor material between said interdigitated first and second electrodes photoconductive within said advancing narrow band by action of said radiant energy; and sweeping a beam of radiant energy along an edge of said first common electrode at a higher sweeping rate than said band of radiant energy and selectively rendering the photoconductor material between said first common electrode and said plurality of first electrodes photoconductive with said sweeping beam of radiant energy to selectively connect said first common electrode to said plurality of first electrodes.

11. A method as claimed in claim 10, wherein:
said beam of radiant energy is swept along said first common electrode edge to sequentially connect electrodes of said plurality of first electrodes to said first common electrode by way of photoconductive material.

12. A method as claimed in claim 10, wherein:
at least said first common electrode is made circular;
said plurality of first electrodes is provided with end portions arranged in a circular array adjacent and about said circular first common electrode;
photoconductor material is provided between said circular first common electrode and said end portions of said plurality of first electrodes; and
said beam of radiant energy is scanned along a peripheral portion of said circular first common electrode.

13. A method as claimed in claim 10, wherein:
a different photoconductor material is provided between said first common electrode and said plurality of first electrodes, than the photoconductor material between said interdigitated first and second electrodes.

14. A method as claimed in claim 10, wherein:
a first photoconductor material having a first rise time is provided between said interdigitated first and second electrodes; and
a second photoconductor material having a second rise time faster than said first rise time is provided between said first common electrode and said plurality of first electrodes.

15. A method as claimed in claim 10, wherein:
said plurality of second electrodes are integral with said second common electrode.

16. A method as claimed in claim 15, wherein:
said beam of radiant energy is swept along said first common electrode edge to sequentially connect electrodes of said plurality of first electrodes to said first common electrode by way of photoconductive material.

17. A method as claimed in claim 10, wherein:
each of said plurality of second electrodes is connected to said second common electrode by providing photoconductor material between said plurality of second electrodes and said second common electrode, and sweeping a further beam of radiant energy along an edge of said second common electrode in synchronism with said beam sweeping at said higher sweeping rate and selectively rendering the photoconductor material between said second common electrode and said plurality of second electrodes photoconductive with said sweeping further beam of radiant energy to selectively connect said second common electrode to said plurality of second electrodes.

18. A method as claimed in claim 17, wherein:
said further beam of radiant energy is swept along said second common electrode edge to sequentially connect electrodes of said plurality of second electrodes to said common second electrode by way of photoconductive material.

19. In a method of scanning an input image into a two-dimensional array, the improvement comprising in combination the steps of:
providing said two-dimensional array with a plurality of interdigitated first and second electrodes;
providing a first common electrode adjacent said plurality of first electrodes;
providing a second common electrode adjacent said plurality of second electrodes;
providing photoconductor material between at least said interdigitated first and second electrodes and between said first common electrode and said plurality of first electrodes;
connecting said first and second common electrodes to electrical equipment with respect to which said array is to be scanned;
connecting each of said plurality of second electrodes to said second common electrode;
exposing the photoconductor material between said interdigitated first and second electrodes to successive portions of said input image to render the latter photoconductor material selectively photoconductive in response to said input image;
sweeping a beam of radiant energy along an edge of said first common electrode and selectively rendering the photoconductor material between said first common electrode and said plurality of first electrodes photoconductive with said sweeping beam of radiant energy to selectively connect said first common electrode to said plurality of first electrodes.

20. A method as claimed in claim 19, wherein:
said beam of radiant energy is swept along said first common electrode edge to sequentially connect electrodes of said plurality of first electrodes to said first common electrode by way of photoconductive material.

21. A method as claimed in claim 19, wherein:
said plurality of second electrodes are integral with said second common electrode.

22. A method as claimed in claim 19, wherein:
a different photoconductor material is provided between said first common electrode and said plurality of first electrodes, than the photoconductor material between said interdigitated first and second electrodes.

23. A method as claimed in claim 19, wherein:
a first photoconductor material having a first rise time is provided between said interdigitated first and second electrodes; and
a second photoconductor material having a second rise time faster than said first rise time is provided between said first common electrode and said plurality of first electrodes.

24. A method as claimed in claim 19, wherein:
at least said first common electrode is made circular;

said plurality of first electrodes is provided with end portions arranged in a circular array adjacent and about said circular first common electrode;

photoconductor material is provided between said circular first common electrode and said end portions of said plurality of first electrodes; and said beam of radiant energy is scanned along a peripheral portion of said circular first common electrode.

25. A method of selectively connecting a plurality of electrodes to electrical equipment, comprising in combination the steps of:

providing a further electrode adjacent said plurality of electrodes;

providing photoconductor material between said further electrode and said plurality of electrodes;

connecting said further electrode to said electrical equipment;

providing and energizing an annular source of radiant energy in spaced relationship to said photoconductor material; and converting radiant energy from said annular source into a spot of radiant energy, scanning said spot along an edge of said further electrode in a continuous scanning path and selectively rendering said photoconductor material photoconductive with said scanning spot of radiant energy to selectively connect said further electrode to said plurality of electrodes.

26. A method as claimed in claim 25, wherein:

said spot of radiant energy is scanned to sequentially connect electrodes of said plurality of electrodes to said further electrode by way of said photoconductive material.

* * * * *